US009578733B2

(12) United States Patent  
Chen

(10) Patent No.: US 9,578,733 B2  
(45) Date of Patent: Feb. 21, 2017

(54) ESD PROTECTION OF ELECTRONIC DEVICE

(71) Applicant: Egis Technology Inc., Taipei (TW)

(72) Inventor: Pin-Yu Chen, Taipei (TW)

(73) Assignee: Egis Technology Inc., Taipei (TW)

( * ) Notice: Subject to any disclaimer, the term of this patent is extended or adjusted under 35 U.S.C. 154(b) by 0 days.

(21) Appl. No.: 15/006,027

(22) Filed: Jan. 25, 2016

(65) Prior Publication Data

US 2016/0381787 A1    Dec. 29, 2016

(30) Foreign Application Priority Data

Jun. 24, 2015   (CN) .............................. 201510351736

(51) Int. Cl.
  *G06K 9/00* (2006.01)
  *H05K 1/02* (2006.01)
  *H05K 1/11* (2006.01)
(52) U.S. Cl.
  CPC ......... *H05K 1/0259* (2013.01); *G06K 9/00013* (2013.01); *H05K 1/115* (2013.01)
(58) Field of Classification Search
  CPC ................. G06K 9/00053; H01L 2224/32225; H01L 2224/32245; H01L 2224/48227; G06F 3/0412
  See application file for complete search history.

(56) References Cited

U.S. PATENT DOCUMENTS

| 6,346,739 | B1* | 2/2002 | Lepert | G06K 9/00053 257/532 |
| 7,187,067 | B2* | 3/2007 | Weng | H01L 27/14636 257/254 |
| 7,630,183 | B2* | 12/2009 | Shin | G06K 9/00053 361/112 |
| 7,940,249 | B2* | 5/2011 | Perreault | G06K 9/00053 178/18.06 |
| 8,050,467 | B2* | 11/2011 | Yang | G06K 9/00026 382/124 |
| 8,231,056 | B2* | 7/2012 | Zabroda | G06K 9/00053 235/454 |

* cited by examiner

*Primary Examiner* — Phuoc Tran

(57) ABSTRACT

An electronic device is provided. A first PCB includes a plurality of ground pads. A fingerprint sensor includes a sensing array, an insulating surface disposed on the sensing array, and a second PCB disposed between the sensing array and the first PCB. The sensing array senses fingerprint information of a user. The second PCB includes a substrate having a first surface and a second surface opposite the first surface, a metal trace disposed on the first surface and adjacent to the sensing array, and a plurality of ESD pads disposed on the second surface and coupled to the first ground pads of the first PCB, respectively. When an ESD event occurs, ESD energy is discharged from the metal trace to the first ground pads of the first PCB through a plurality of vias and the ESD pads without passing through the sensing array.

18 Claims, 3 Drawing Sheets

ESD PROTECTION OF ELECTRONIC DEVICE

CROSS REFERENCE TO RELATED APPLICATIONS

This Application claims priority of China Patent Application No. 201510351736.8, filed on Jun. 24, 2015, the entirety of which is incorporated by reference wherein.

BACKGROUND OF THE INVENTION

Field of the Invention

The invention relates to an electronic device, and more particularly to an electronic device with a fingerprint sensor.

Description of the Related Art

In recent years, biological identification technology has become increasingly mature, and different biological features can be used for identifying users. Since the recognition rate and accuracy of fingerprint identification technology are better than those of other biological feature identification technologies, fingerprint identification and verification are used extensively in various areas. For example, cell phones, tablet computers, personal computers, electronic locks and other electronic devices can be equipped with a fingerprint identification function for identifying the user's identity so as to increase security.

Fingerprint identification and verification technology detects a user's fingerprint pattern, captures fingerprint data from the fingerprint pattern, and saves the fingerprint data to the memory as a template. Thereafter, the user presses or slides a finger on or over the fingerprint sensor so that a fingerprint is captured and compared with the template. If the two match, then the user's identity is confirmed.

With the continued miniaturization of the integrated circuits (ICs) used in fingerprint sensors, these integrated circuits have become more susceptible to damage caused by electrostatic discharge (ESD). ESD is a phenomenon that occurs when excess charges are transmitted from the I/O pins to the integrated circuit too quickly, damaging the internal circuit.

Therefore, it is desired to dispose ESD protection circuits into a fingerprint sensor to protect the devices and circuitry of the integrated circuit against ESD damage.

BRIEF SUMMARY OF THE INVENTION

Electronic devices are provided. An embodiment of an electronic device of the invention is provided. The electronic device comprises a first printed circuit board (PCB) and a fingerprint sensor disposed on the first PCB. The first PCB comprises a plurality of first ground pads. The fingerprint sensor comprises a sensing array, an insulating surface disposed on the sensing array, and a second PCB disposed between the sensing array and the first PCB. The sensing array senses fingerprint information of a user. The second PCB comprises a substrate comprising a first surface and a second surface opposite the first surface, at least one metal trace disposed on the first surface of the substrate and adjacent to the sensing array, and a plurality of electrostatic discharge (ESD) pads disposed on the second surface of the substrate and coupled to the first ground pads of the first PCB respectively. When an ESD event occurs, ESD energy is discharged from the metal trace to the first ground pads of the first PCB through a plurality of first vias in the substrate and the ESD pads without passing through the sensing array.

Furthermore, another embodiment of an electronic device of the invention is provided. The electronic device comprises a first printed circuit board (PCB) comprising a plurality of first ground pads, and a fingerprint sensor disposed on the first PCB. The fingerprint sensor comprises a sensing array sensing fingerprint information of a user, an insulating surface disposed on the sensing array, and a second PCB disposed between the sensing array and the first PCB. The second PCB comprises a substrate, a first metal trace disposed on the first surface of the substrate and adjacent to the sensing array, a second metal trace disposed on the first surface of the substrate and adjacent to the sensing array, and a plurality of electrostatic discharge (ESD) pads disposed on the second surface of the substrate, and coupled to the first ground pads of the first PCB, respectively. The substrate comprises a first surface adjacent to the sensing array and a second surface adjacent to the first PCB. The first and metal traces are symmetrically disposed on the first surface of the substrate. When an ESD event occurs, ESD energy is discharged from the first metal trace or the second metal trace to the first ground pads of the first PCB through a plurality of first vias in the substrate and the ESD pads without passing through the sensing array.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

When a user presses or slides his or her finger on or over a fingerprint sensor of an electronic device, the fingerprint sensor will detect and obtain different capacitance values corresponding to the ridges and valleys. Next, voltage values corresponding to the capacitance values are obtained by using a charge-sharing technique, and the voltage value is converted into a digital code. The digital code is provided to a processor of a function module of the electronic device for subsequent operation and fingerprint identification.

Figure 1:
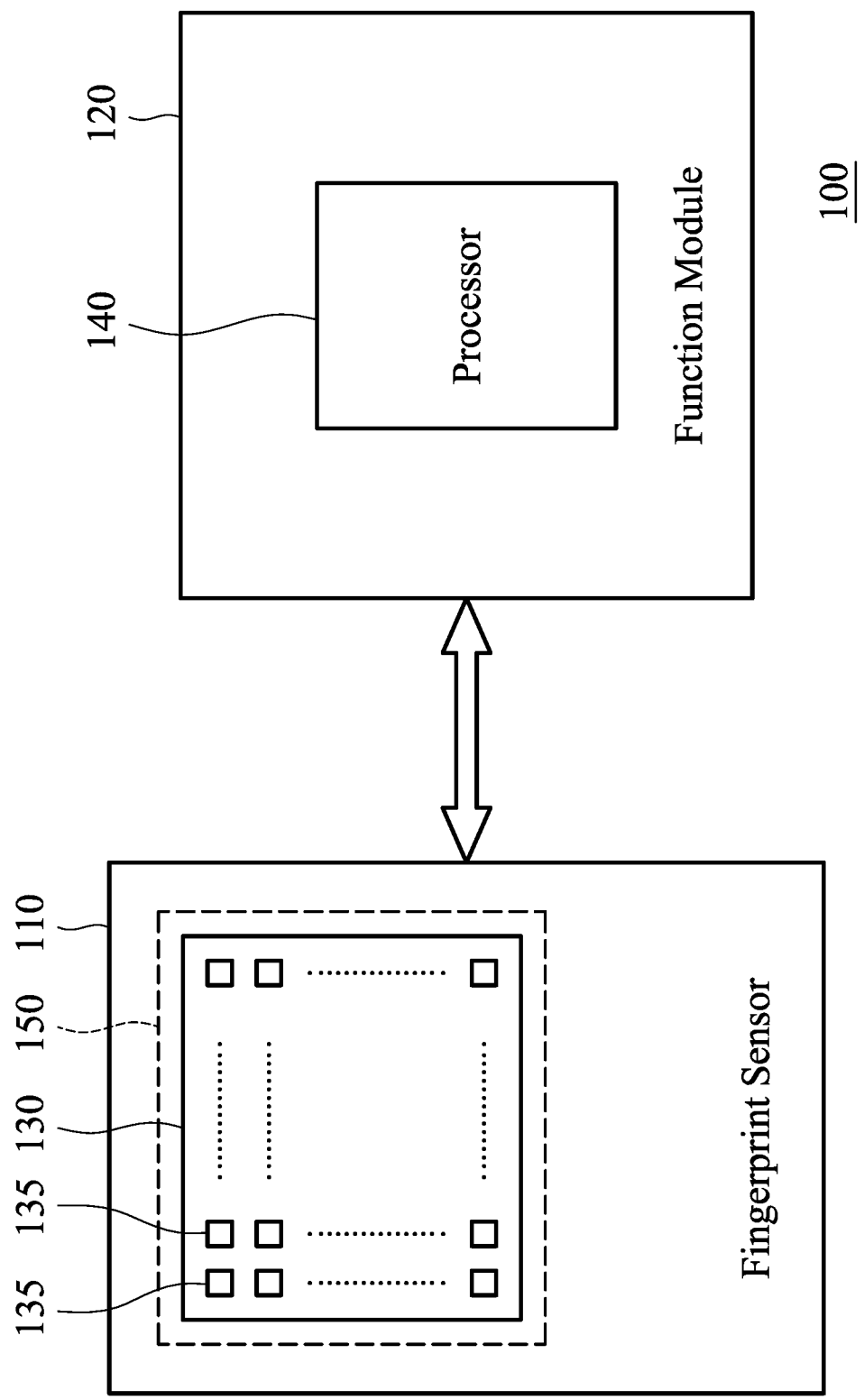
FIG. 1 shows an electronic device according to an embodiment of the invention.

FIG. 1 shows an electronic device 100 according to an embodiment of the invention. The electronic device 100 comprises a fingerprint sensor 110 and a function module 120. The fingerprint sensor 110 comprises a sensing array 130 and an insulating surface 150. In order to simplify the description, the other circuits (such as readout circuit) in the fingerprint sensor 110 will not be described further. The sensing array 130 is formed by a plurality of sensing units 135 arranged in a two-dimensional manner, wherein the insulating surface 150 overlays the whole sensing units 135 of the sensing array 130. Furthermore, in the embodiment, the sensing units 135 of the sensing array 130 are arranged in a rectangle. In the embodiment, the function module 120 comprises a processor 140. According to the sensing voltages of the sensing units 135 of the sensing array 130, the fingerprint sensor 110 can provide fingerprint information of a user's finger to the processor 140 of the function module 120. For example, the fingerprint sensor 110 can determine whether the user's finger is in contact with the insulating surface 150 and determine that the sensing voltage corresponds to a fingerprint ridge or a fingerprint valley of the finger. Next, according to the fingerprint information from the fingerprint sensor 110, the processor 140 can use a fingerprint identification algorithm to perform a fingerprint identification operation.

Figure 2:
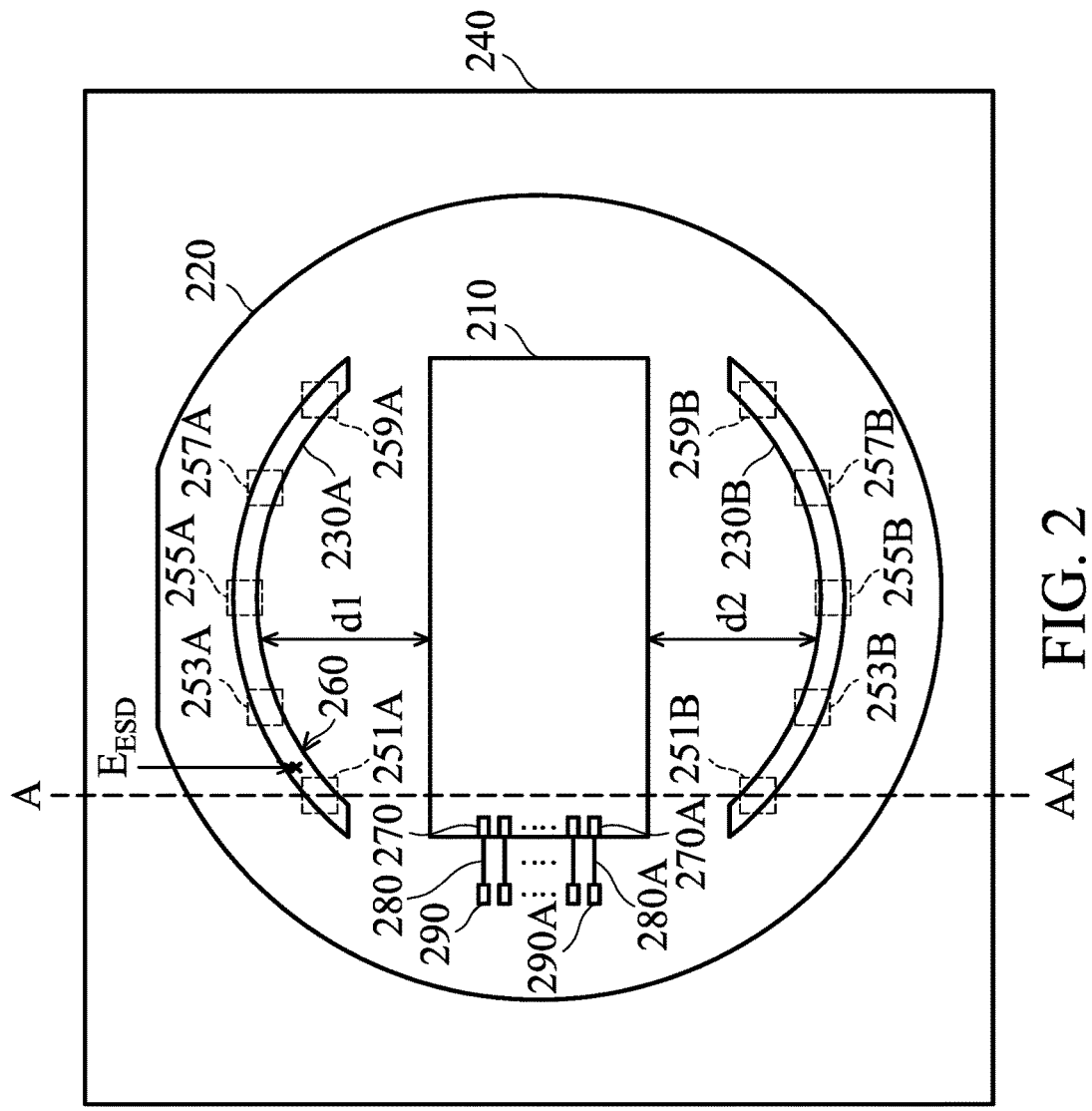
FIG. 2 shows a top view of the electronic device of FIG. 1 according to an embodiment of the invention.

FIG. 2 shows a top view of the electronic device 100 of FIG. 1 according to an embodiment of the invention. In FIG. 2, a molding compound of the fingerprint sensor 110 is removed to simplify the description, wherein the molding compound of the fingerprint sensor 110 will described below. Referring to FIG. 2, the fingerprint sensor 110 comprises a sensing die 210, and a printed circuit board (PCB) 220, and the function module 120 comprises a PCB 240. In general, the sensing die 210 comprises the sensing array 130, a readout module (not shown) and so on. In the sensing die 210, after obtaining a sensing output of the sensing array 130, the sensing die 210 determines whether the user's finger is in contact with the insulating surface 150 disposed on the sensing array 130 and further obtains the fingerprint information of the finger so as to determine that the sensing output corresponds to a fingerprint ridge or a fingerprint valley of the finger. Next, the fingerprint sensor 110 provides the fingerprint information of the finger to the processor 140 of the function module 120 for subsequent processes, for example, a fingerprint identification operation is performed by a fingerprint identification algorithm. In FIG. 2, the PCB 220 is a double-sided PCB. In other embodiments, the PCB 220 is a multi-layer PCB. In order to simplify the description, the other surface mount devices (SMDs) on the PCB 220 will not be described further. Moreover, the pins 270 of the sensing die 210 are coupled to the pads 290 of the PCB 220 through the bonding wires 280 so as to transmit the fingerprint information of the finger to the PCB 240 of the function module 120. Thus, the processor 140 disposed on the PCB 240 can obtain the fingerprint information of the finger from the sensing die 210. Similarly, in order to simplify the description, the devices on the PCB 240 will not be described further.

Figure 3:
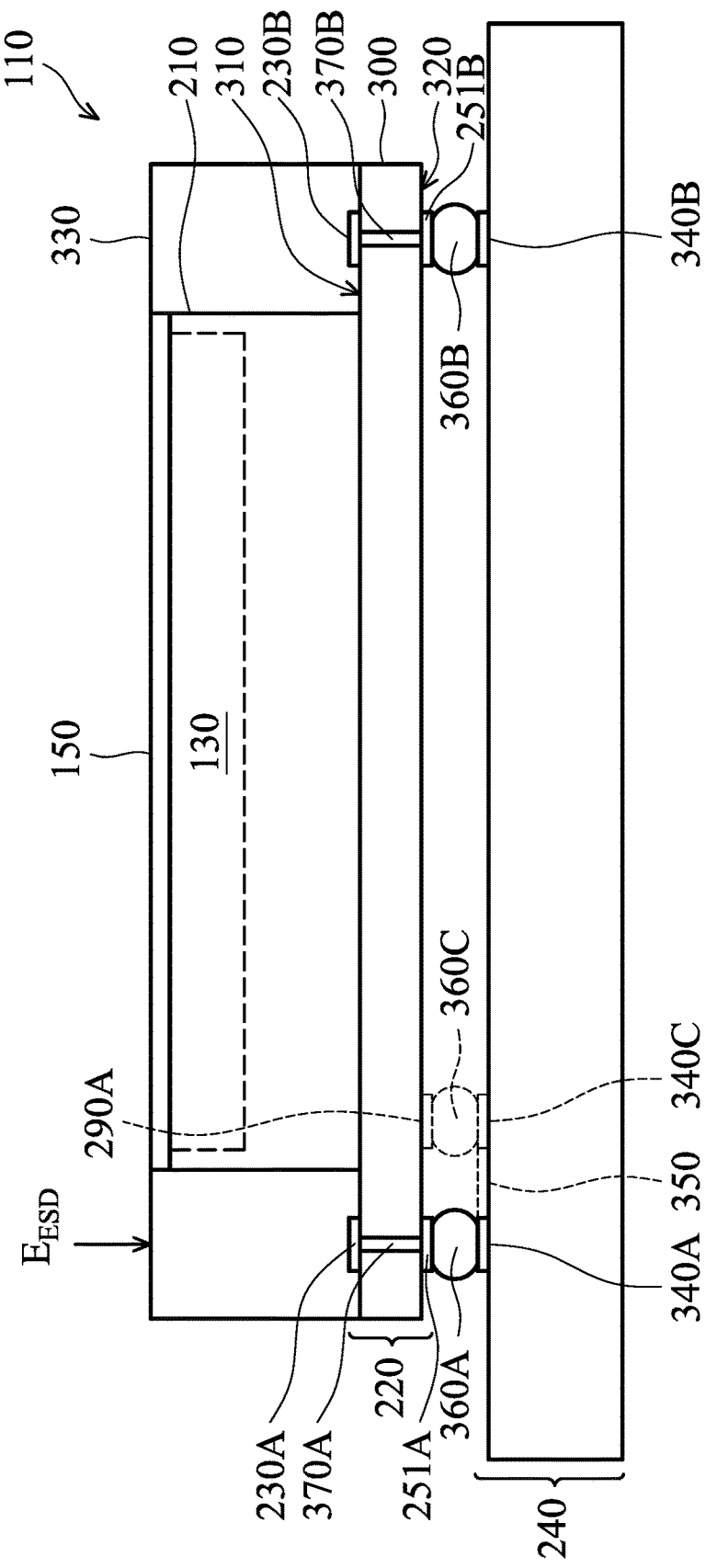
FIG. 3 shows a sectional diagram along a section line A-AA of the electronic device of FIG. 2.

FIG. 3 shows a sectional diagram along a section line A-AA of the electronic device of FIG. 2. Referring to FIGS. 2 and 3 together, the sensing die 210 is disposed on the PCB 220. The sensing array is implemented in the sensing die, i.e. the sensing die 210 comprising the sensing array 130, wherein the sensing array 130 is formed by a plurality of sensing units arranged in a two-dimensional manner. Furthermore, the insulating surface 150 overlays the sensing array 130. The PCB 220 comprises a substrate 300, the metal traces 230A and 230B, and the electrostatic discharge (ESD) pads 251A-259A and 251B-259B. The substrate 300 is a core insulator, which has a first surface 310 and a second surface 320, wherein the second surface 320 is disposed opposite the first surface 310. In the embodiment, the first surface 310 of the substrate 300 is adjacent to the sensing die 210, i.e. the sensing die 210 is disposed on the first surface 310 of the substrate 300. Furthermore, the second surface 320 of the substrate 300 is adjacent to the PCB 240 of the function module 120, i.e. the fingerprint sensor 110 is disposed on the PCB 240 through the second surface 320 of the substrate 300. The metal traces 230A and 230B are disposed on the first surface 310 of the substrate 300, and the metal traces 230A and 230B partially surround the sensing die 210. In the embodiment, the PCB 220 has a specific shape. For example, the PCB 220 of FIG. 2 has a circular shape. In the embodiment, the shapes of the metal traces 230A and 230B correspond to the specific shape of the PCB 220. It should be noted that the metal traces 230A and 230B are symmetrically disposed around the sensing die 210 and partially surround the sensing die 210. For example, on the first surface 310 of the substrate 300, a distance d1 between the metal trace 230A and the sensing die 210 is equal to a distance d2 between the metal trace 230B and the sensing die 210. Furthermore, the metal traces 230A and 230B are coupled to the ESD pads 251A-259A and 251B-259B disposed on the second surface 320 of the substrate 300 through a plurality of vias disposed in the substrate 300, wherein the ESD pads 251A-259A are disposed directly below the metal trace 230A, and the ESD pads 251B-259B are disposed directly below the metal trace 230B. For example, the ESD pad 251A is directly connected to the metal trace 230A through the via 370A, and the ESD pad 251B is directly connected to the metal trace 230B through the via 370B. It should be noted that the positions of the ESD pads 251A-259A and 251B-259B are determined according to actual applications. For example, the distance between the ESD pad 251A and the sensing die 210 is equal to or different from the distance between the ESD pad 251B and the sensing die 210. Furthermore, according to actual application, the ESD pads are equidistantly or non-equidistantly disposed below the metal trace. For example, for the metal trace 230A, the distance between the ESD pad 251A and the ESD pad 253A is equal to or different from the distance between the ESD pad 253A and the ESD pad 255A.

In FIGS. 2 and 3, the ESD pads 251A-259A and 251B-259B on the second surface 320 of the substrate 300 are mounted on the ground pads of the PCB 240 through the corresponding solder balls. For example, the ESD pad 251A of the PCB 220 is coupled to a ground pad 340A of the PCB 240 through a solder ball 360A, and the ESD pad 251B of the PCB 220 is coupled to a ground pad 340B of the PCB 240 through a solder ball 360B. Moreover, the ground pin 270A of the sensing die 210 is coupled to the ground pad 340C of the PCB 240 through the corresponding bonding wire 280A, the ground pad 290A and a solder ball 360C. It should be noted that the ESD pads 251A-259A and the ESD pads 251B-259B are electrically insulated from the ground pad (e.g. 290A) of the sensing die 210 on the PCB 220 of the fingerprint sensor 110. In the embodiment, the ESD pads of the PCB 220 (e.g. 251A-259A and 251B-259B) are electrically connected to the ground pad (e.g. 290A) of the PCB 220 through the PCB 240 of the function module 120. For example, through the ground pad 340A, the trace 350 and the ground pad 340C on the PCB 240, the ESD pad 251A of the PCB 220 is electrically connected to the ground pad 290A.

In FIG. 3, the fingerprint sensor 110 further comprises a molding compound 330, such as Epoxy molding compound (EMC), which is formed on the first surface 310 of the substrate 300 through a molding process, and the molding compound 330 covers the metal traces 230A and 230B. It should be noted that the molding compound 330 surrounds the sensing die 210, and the molding compound 330 has an opening so that the insulating surface 150 is exposed. Thus, after completing the package of the fingerprint sensor 110, the user's fingers can come into contact with the insulating surface 150 for sensing. To simplify the description, configuration of the solder resists (SR) of the PCBs 220 and 240 will not be described further. When an ESD event occurs, ESD energy $E_{ESD}$ from the top of the molding compound 330 is speedily transmitted to the nearest ESD pad on the PCB 220 through the metal trace 230A and/or the metal trace 230B so as to discharge to the ground of the PCB 240. For example, when the ESD energy $E_{ESD}$ is released to the metal trace 230A (as shown in label 260), the ESD energy $E_{ESD}$ is transmitted to the nearest ESD pad 251A through the metal trace 230A and the via 370A, and the ESD energy $E_{ESD}$ is discharged to the ground of the PCB 240 through the solder ball 360A and the ground pad 340A in sequence. Thus, the ESD energy $E_{ESD}$ is transmitted to the ground of the function module 120 through a discharge path formed by the metal trace 230A, wherein the discharge path does not pass through the sensing die 210. In general, the ground of the function module 120 is coupled to a larger ground plane, thereby quickly providing a discharge path. Therefore, the ESD energy $E_{ESD}$ will not damage the sensing die 210. Furthermore, compared with a conventional fingerprint sensor having an ESD ring (e.g. a conductive strip) disposed between an insulating surface and a molding compound, the manufacturing cost is decreased by disposing the metal traces 230A and 230B on the PCB 220. Moreover, in response to the shape and size of the PCB 220, the shapes and the amounts of the metal traces 230A and 230B can be adjusted appropriately.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
    a first printed circuit board (PCB), comprising:
        a plurality of first ground pads; and
    a fingerprint sensor disposed on the first PCB, comprising:
        a sensing array, sensing fingerprint information of a user;
        an insulating surface disposed on the sensing array; and
        a second PCB disposed between the sensing array and the first PCB, comprising:
            a substrate, comprising a first surface and a second surface opposite the first surface;
            at least one metal trace disposed on the first surface of the substrate and adjacent to the sensing array; and
            a plurality of electrostatic discharge (ESD) pads disposed on the second surface of the substrate, and coupled to the first ground pads of the first PCB, respectively,
    wherein when an ESD event occurs, ESD energy is discharged from the metal trace to the first ground pads of the first PCB through a plurality of first vias in the substrate and the ESD pads without passing through the sensing array.

2. The electronic device as claimed in claim 1, wherein the ESD pads are disposed directly below the metal trace.

3. The electronic device as claimed in claim 1, wherein the metal trace partially surrounds the sensing array on the first surface of the substrate.

4. The electronic device as claimed in claim 1, further comprising:
    a molding compound disposed on the first surface of the substrate of the
        second PCB, covering the metal trace.

5. The electronic device as claimed in claim 4, wherein the molding compound surrounds the sensing array and the insulating surface of the fingerprint sensor, and the molding compound has an opening so that the insulating surface is exposed.

6. The electronic device as claimed in claim 1, wherein a plurality of sensing units of the sensing array are arranged in a rectangle, and the metal trace is disposed on one side of the rectangle on the first surface of the substrate.

7. The electronic device as claimed in claim 1, wherein the sensing array is disposed in a sensing die, and the sensing die is implemented on the second PCB, and the second PCB further comprises:
    at least a second ground pad disposed on the second surface of the substrate, and coupled to a ground pin of the sensing die through at least a second via in the substrate.

8. The electronic device as claimed in claim 7, wherein the second ground pad is electrically insulated from the ESD pads on the second PCB.

9. The electronic device as claimed in claim 7, wherein the ground pin of the sensing die is coupled to the first ground pads of the first PCB through the second ground pad of the second PCB, such that the ESD pads are electrically connected to the ground pin of the sensing die through the first ground pads of the first PCB and the second pad of the second PCB.

10. An electronic device, comprising:
    a first printed circuit board (PCB), comprising:
        a plurality of first ground pads; and
    a fingerprint sensor disposed on the first PCB, comprising:
        a sensing array, sensing fingerprint information of a user;
        an insulating surface disposed on the sensing array; and
        a second PCB disposed between the sensing array and the first PCB, comprising:
            a substrate, comprising a first surface adjacent to the sensing array and a second surface adjacent to the first PCB;
            a first metal trace disposed on the first surface of the substrate and adjacent to the sensing array;
            a second metal trace disposed on the first surface of the substrate and adjacent to the sensing array, wherein the first and second metal traces are symmetrically disposed on the first surface of the substrate; and
            a plurality of electrostatic discharge (ESD) pads disposed on the second surface of the substrate, and coupled to the first ground pads of the first PCB,
    wherein when an ESD event occurs, ESD energy is discharged from the first metal trace or the second metal trace to the first ground pads of the first PCB through a plurality of first vias in the substrate and the ESD pads without passing through the sensing array.

11. The electronic device as claimed in claim 10, wherein the ESD pads are disposed directly below the first and second metal traces.

12. The electronic device as claimed in claim 10, wherein the first and second metal traces partially surround the sensing array on the first surface of the substrate.

13. The electronic device as claimed in claim 10, further comprising:

a molding compound disposed on the first surface of the substrate of the second PCB, covering the first and second metal traces.

14. The electronic device as claimed in claim 13, wherein the molding compound surrounds the sensing array and the insulating surface of the fingerprint sensor, and the molding compound has an opening so that the insulating surface is exposed.

15. The electronic device as claimed in claim 10, wherein a plurality of sensing units of the sensing array are arranged in a rectangle, and the first metal trace is disposed on a first side of the rectangle and the second metal trace is disposed on a second side of the rectangle on the first surface of the substrate, wherein the second side is opposite the first side in the rectangle.

16. The electronic device as claimed in claim 10, wherein the sensing array is disposed in a sensing die, and the sensing die is implemented on the second PCB, and the second PCB further comprises:

at least a second ground pad disposed on the second surface of the substrate, and coupled to a ground pin of the sensing die through at least a second via in the substrate.

17. The electronic device as claimed in claim 16, wherein the second ground pad is electrically insulated from the ESD pads on the second PCB.

18. The electronic device as claimed in claim 17, wherein the ground pin of the sensing die is coupled to the first ground pads of the first PCB through the second ground pad of the second PCB, such that the ESD pads are electrically connected to the ground pin of the sensing die through the first ground pads of the first PCB and the second pad of the second PCB.

* * * * *